United States Patent
Chang et al.

(10) Patent No.: US 7,937,643 B1
(45) Date of Patent: May 3, 2011

(54) MOBILE COMMUNICATION DEVICE AND DATA RECEPTION METHOD

(75) Inventors: I-Ping Chang, Tainan (TW); Chun-Ming Kuo, Taipei County (TW); Chi-Yeh Yu, Hsinchu (TW); Shih-Kung Chang, Chiayi (TW); Ho-chi Huang, Hsinchu Hsien (TW)

(73) Assignee: Mediatek Inc., Hsin-Chu (TW)

( * ) Notice: Subject to any disclaimer, the term of this patent is extended or adjusted under 35 U.S.C. 154(b) by 956 days.

(21) Appl. No.: 11/779,903

(22) Filed: Jul. 19, 2007

Related U.S. Application Data

(60) Provisional application No. 60/825,935, filed on Sep. 18, 2006.

(51) Int. Cl.
*H03M 13/00* (2006.01)
(52) U.S. Cl. ...................................... 714/758
(58) Field of Classification Search .................... 714/758
See application file for complete search history.

(56) References Cited

U.S. PATENT DOCUMENTS

| | | | |
|---|---|---|---|
| 5,027,357 A | 6/1991 | Yu et al. | |
| 5,136,592 A | 8/1992 | Weng | |
| 5,432,800 A * | 7/1995 | Kuroda et al. | 714/758 |
| 5,602,857 A | 2/1997 | Zook et al. | |
| 5,778,013 A | 7/1998 | Jedwab | |
| 5,867,509 A | 2/1999 | Tanaka | |
| 6,125,469 A | 9/2000 | Zook et al. | |
| 6,366,624 B1 * | 4/2002 | Balachandran et al. | 375/341 |
| 6,427,219 B1 | 7/2002 | Yang | |
| 6,944,206 B1 * | 9/2005 | Dent | 375/144 |
| 6,993,705 B1 | 1/2006 | MacLellan | |
| 2010/0223528 A1 * | 9/2010 | Lee et al. | 714/758 |

* cited by examiner

*Primary Examiner* — Scott T Baderman
*Assistant Examiner* — Enam Ahmed
(74) *Attorney, Agent, or Firm* — Thomas|Kayden

(57) ABSTRACT

A mobile communication device and a data reception method implemented thereby are provided. An antenna receives a signal, and an inner receiver demodulates the received signal to generate an equalizer output. A channel decoder is coupled to the inner receiver, decoding the equalizer output to generate a data sequence. A quality estimator estimates signal quality of the received signal to generate a quality value. An error checker selectively performs cyclic redundancy code (CRC) check or CRC correction on the data sequence according to the quality value.

10 Claims, 4 Drawing Sheets

MOBILE COMMUNICATION DEVICE AND DATA RECEPTION METHOD

CROSS REFERENCE TO RELATED APPLICATIONS

This application claims the benefit of U.S. Provisional Application No. 60/825,935, filed on Sep. 18, 2006, which is incorporated herein by reference.

BACKGROUND OF THE INVENTION

1. Field of the Invention

The invention relates to telecommunication, and in particular, to cyclic redundancy code (CRC) error correction for data received in a mobile device.

2. Description of the Related Art

FIG. 1 shows a conventional mobile device. The architecture shown is simplified to present a data reception path. An antenna 102 receives RF signals, and through an inner receiver 110, the received signal is demodulated to generate an equalizer output. As an example, the inner receiver 110 comprises receiver components such as demodulator 104 and equalizer 106. A channel decoder 112 decodes the equalizer output by FEC (forward error correction) algorithms such as Reed Solomon (RS) code decoding and convolutional code decoding algorithms, and a digital data sequence is output therefrom for post processes. Conventionally, an error checker 114 further checks the data sequence to ensure data integrity. If a CRC error is detected in the data sequence, and the erroneous portion is reparable, the error checker 114 may perform a CRC correction on the data sequence, outputting a corrected data sequence.

FIG. 2 is a flowchart of a conventional data reception method. A data path processed by the mobile device in FIG. 1 is specifically described as follows. In step 202, an equalizer output is generated by the inner receiver 110. In step 204, the equalizer output is de-interlaced and decoded in the channel decoder 112. In step 206, CRC check is performed on the data sequence. If no error is detected, the data sequence is output in step 212. If a CRC error is detected, step 208 is processed to determine whether the CRC error is correctable. If correctable, in step 207, the error checker 114 performs a CRC correction on the data sequence and outputs it in step 212. Otherwise, if not correctable, step 210 discards the data sequence, and reports the error for further exception control.

CRC correction provided by the error checker 114, however, is less than robust. For example, a false data sequence may accidentally generate a correct CRC check result. If the signal quality is poor, the inner receiver 110 generate equalizer outputs with high error rate. Consequently in step 206, the error checker 114 may falsely detect the erroneous data sequence as a correct one based on the nature of CRC algorithm, causing an erroneous data sequence to be output in step 212. Furthermore, a CRC correction process may also render erroneous outputs. For example, CRC correction performed in step 207 may generate a false result from an erroneous input. The false data sequence may cause system failure that degrades system performance. Thus, an enhanced architecture is desirable.

BRIEF SUMMARY OF THE INVENTION

An exemplary embodiment of a mobile communication device is provided. An antenna receives a signal, and an inner receiver demodulates the received signal to generate an equalizer output. A channel decoder is coupled to the inner receiver, decoding the equalizer output to generate a data sequence. A quality estimator estimates signal quality of the received signal to generate a quality value. An error checker selectively performs cyclic redundancy code (CRC) check or CRC correction on the data sequence according to the quality value.

If the quality value exceeds a threshold, the quality estimator sends an enable signal to the error checker to enable its CRC correction function. The error checker performs both CRC check and CRC correction on the data sequence if enabled by the enable signal. Otherwise, if the quality value does not exceed the threshold, the quality estimator does not send the enable signal, thus the CRC correction function in the error checker is not enabled. The error checker performs only CRC check to the data sequence since the CRC correction function is not enabled.

The quality estimator may calculate bit error probability (BEP) of the equalizer output, and generate the quality value inversely proportional to the BEP. Alternatively, the quality estimator may calculate signal to noise ratio (SNR) of the received signal, and generate the quality value proportional to the SNR.

A data reception method implemented by the mobile communication device is also provided. A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
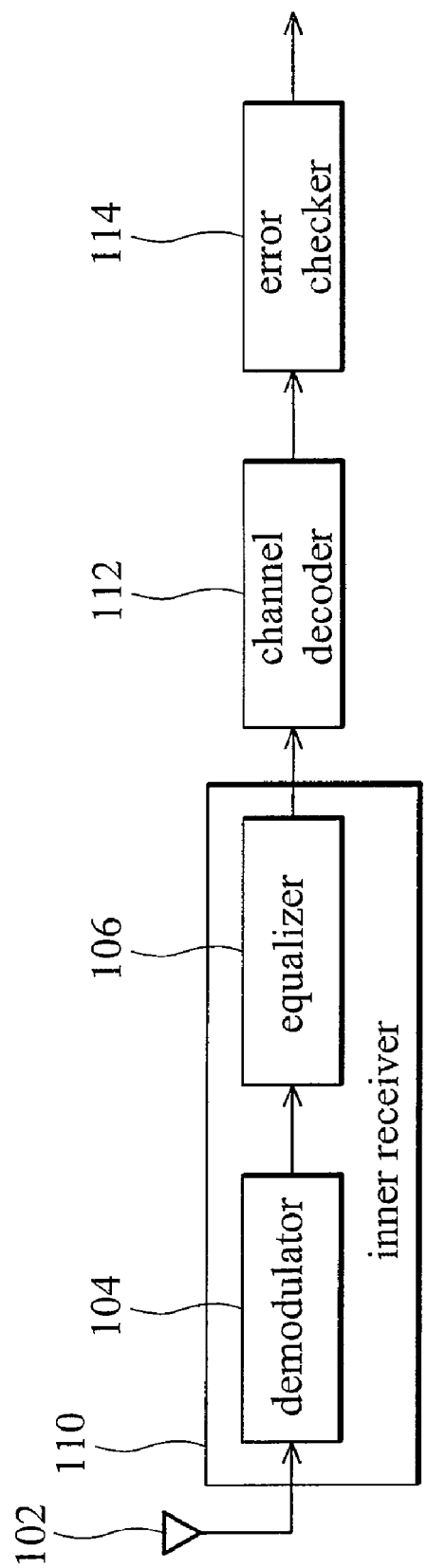
FIG. 1 shows a conventional mobile device.
Figure 2:
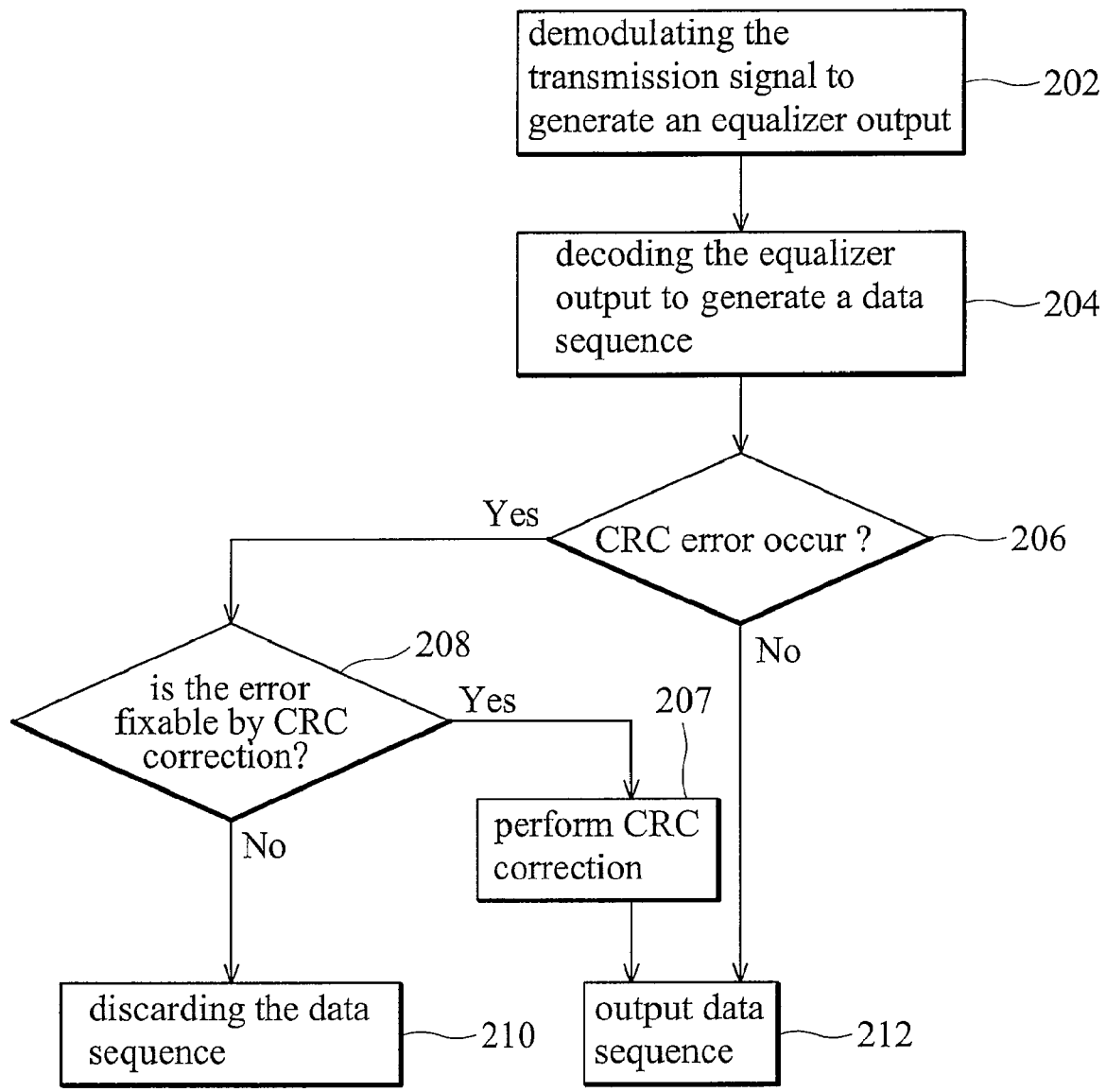
FIG. 2 is a flowchart of a conventional data reception method.
Figure 3:
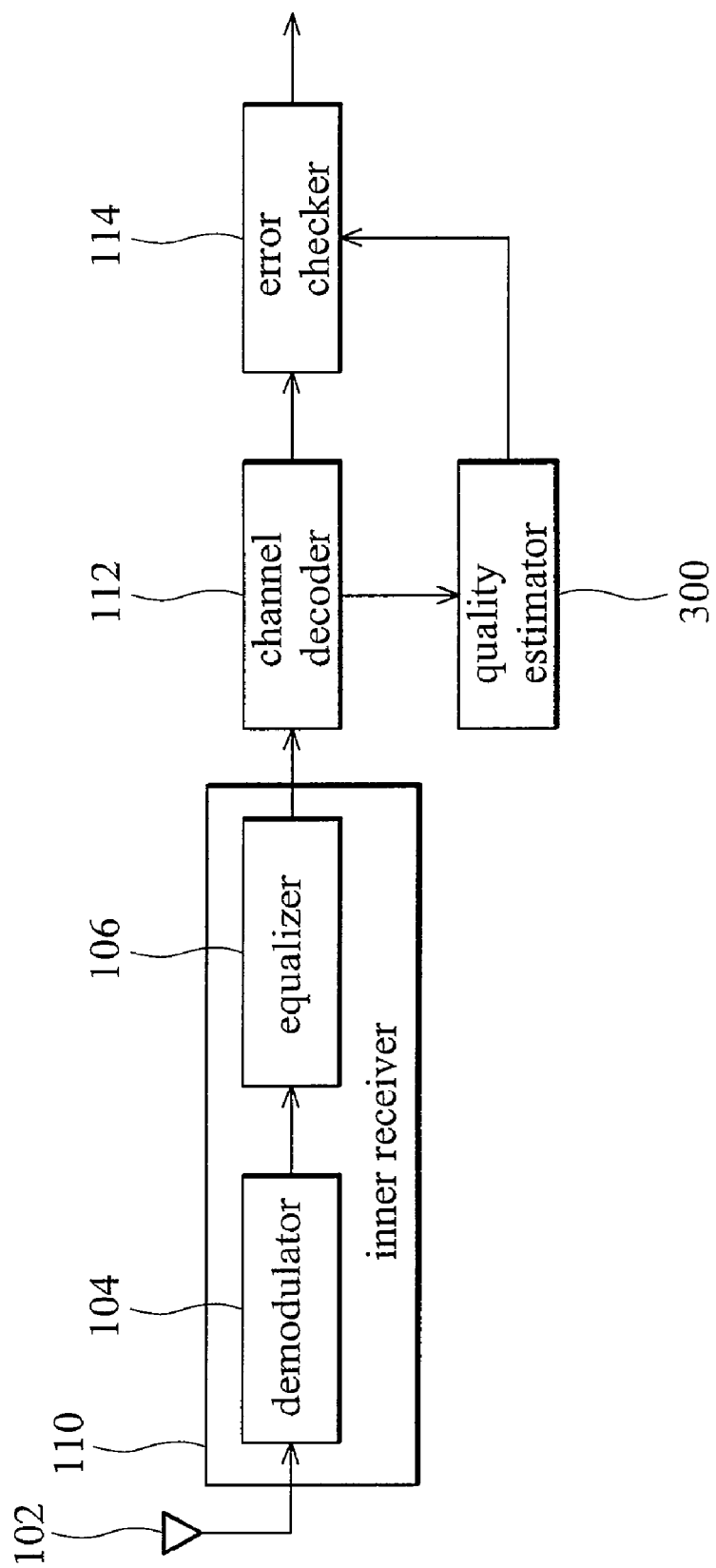
FIG. 3 shows an embodiment of a mobile device according to the invention.

FIG. 3 shows an embodiment of a mobile device according to the invention. Signal quality is estimated as a reference for CRC correction. As known, the antenna 102 receives a signal, the inner receiver 110 demodulates the received signal and generates an equalizer output, and the channel decoder 112 decodes the equalizer output to generate a data sequence. In the embodiment, a quality estimator 300 is coupled to the channel decoder 112, estimating signal quality of the received signal to generate a quality value. To enhance error correction ability, the error checker 114 performs CRC correction in a selective fashion according to the quality value. Specifically, CRC correction is only enabled when signal quality is good, and if signal quality is poor, CRC correction is disabled.

In a practical embodiment, a threshold is configured. If the quality value exceeds the threshold, such a case indicates that the received signal or the demodulated signal has good quality. Consequently, the quality estimator 300 sends an enable signal to the error checker 114 to enable CRC correction therein. When enabled, the error checker 114 performs both CRC check and CRC correction on the data sequence. On the contrary, if the quality value does not exceed the threshold, it means that the received signal has poor quality. In this case, the quality estimator 300 does not send the enable signal to the error checker 114, so CRC correction in the error checker 114 is not enabled, and only CRC check is performed on the data sequence.

The quality value can be generated in various ways. For example, the quality estimator 300 may calculate bit error probability (BEP) of the equalizer output, which is inversely proportional to the signal quality. Thus, a quality value is simply calculated from the BEP according to the reverse linear relationship. Alternatively, signal to noise ratio (SNR) of the received signal may be used to calculate the quality value. The quality estimator 300 first estimates the SNR, and accordingly generates the quality value proportional to the SNR. In addition to BEP and SNR, many other signal characteristics can be used as the quality indicator as well. For example, signal to interference plus noise ratio (SINR), carrier to noise ratio (CNR), received signal power, carrier to noise plus interference ratio, node metric of the equalizer, soft value of the equalizer output, residual error after channel decoding, training sequence code (TSC) error count, etc. The quality estimator 300 may be implemented to obtain information from the demodulator 104, equalizer 106, and/or channel decoder 112 to calculate the quality value.

Figure 4:
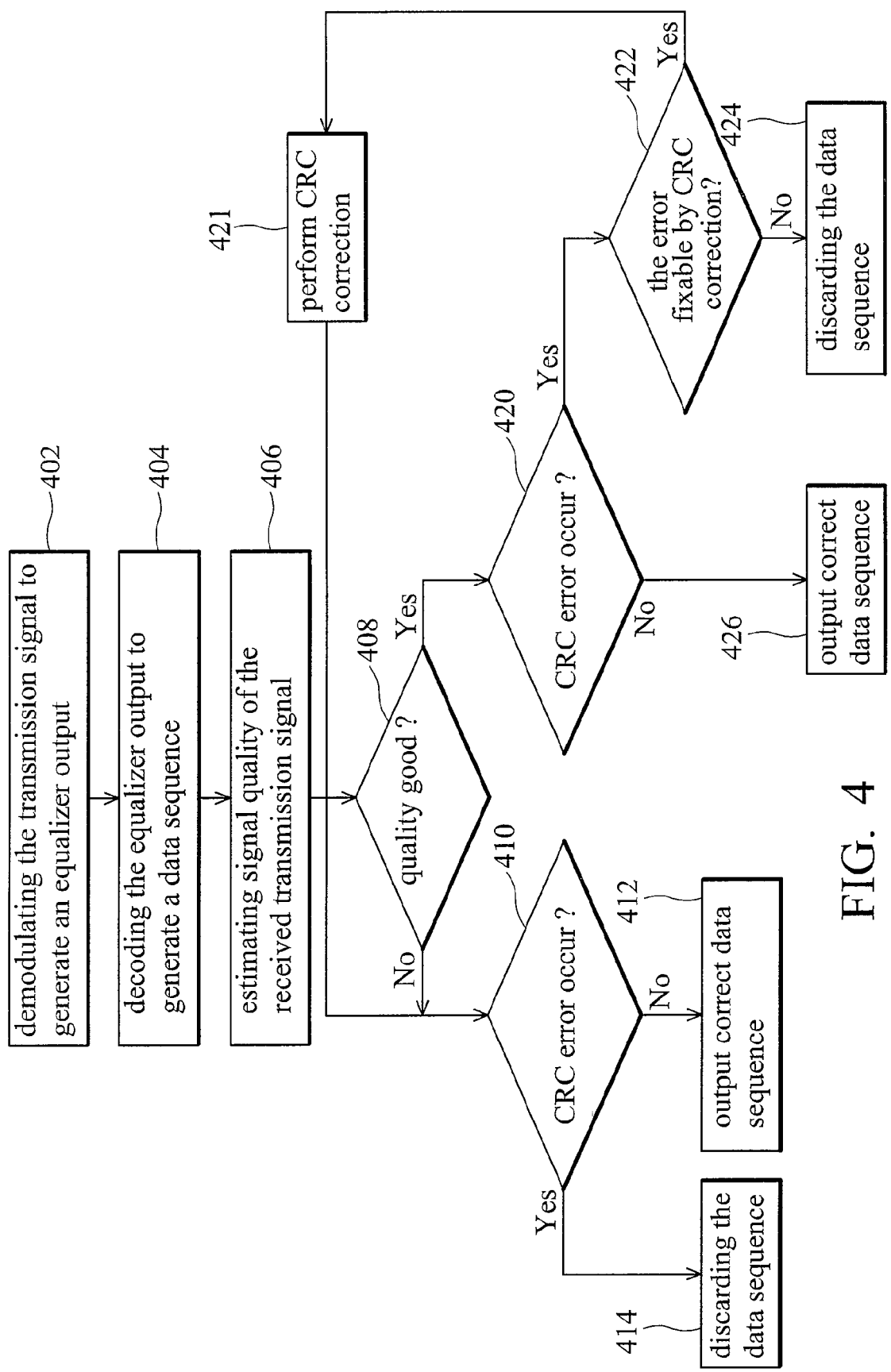
FIG. 4 is a flowchart of a data reception method according to an embodiment of the invention.

FIG. 4 is a flowchart of a data reception method according to an embodiment of the invention, in which CRC correction is conditionally enabled or disabled. In step 402, an equalizer output is generated from the inner receiver 110. In step 404, the channel decoder 112 decodes the equalizer output to generate a data sequence. In step 406, the quality estimator 300 receives information from the inner receiver 110 and/or the channel decoder 112 to estimate signal quality of the received signal. A quality value is therefore generated. In step 408, it is determined whether the quality value exceeds a threshold. If not, only CRC check is performed in step 410. If no CRC error is found in step 410, the data sequence is directly output in step 412. Otherwise, if CRC error is found in the data sequence of poor quality, step 414 discards the data sequence and reports the error. In step 408, if the quality is detected to be good, CRC check is first performed in step 420. If no CRC error is detected in the CRC check, the correct data sequences of good quality are output in step 426. If CRC error is detected, step 422 is processed to further determine whether the CRC error is correctable. For the case of correctable errors, step 422 is followed by step 421, in which CRC error correction is performed. Otherwise, for the case of irreparable errors, the erroneous data sequences are discarded in step 424. After CRC error correction in step 421, the process returns to step 410 for another CRC check. If the corrected data passes the CRC check, the corrected data could be output in step 412. Otherwise, the data should still be discarded in step 414. Thus, CRC error correction is only performed when sufficient signal quality is confirmed and a second CRC error detection is performed after CRC error correction, wherein false CRC correction is efficiently reduced.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A mobile communication device, comprising:
   an antenna, receiving a signal;
   an inner receiver, coupled to the antenna, demodulating the received signal and generating an equalizer output;
   a channel decoder, coupled to the inner receiver, decoding the equalizer output to generate a data sequence;
   a quality estimator, coupled to the channel decoder, estimating signal quality of the received signal to generate a quality value; and
   an error checker, selectively performing cyclic redundancy code (CRC) correction on the data sequence according to the quality value;
   wherein:
   if the quality value exceeds a threshold, the quality estimator sends an enable signal to the error checker to enable its CRC correction function; and
   the error checker performs both CRC check and CRC correction on the data sequence if enabled by the enable signal.

2. The mobile communication device as claimed in claim 1, wherein:
   if the quality value does not exceed the threshold, the quality estimator does not send the enable signal, such that CRC correction function in the error checker is not enabled; and
   the error checker performs only CRC check to the data sequence since the CRC correction function is not enabled.

3. The mobile communication device as claimed in claim 1, wherein:
   the quality estimator calculates a bit error probability (BEP) of the equalizer output; and
   the quality estimator generates the quality value according to the BEP; wherein the quality value is inversely proportional to the BEP.

4. The mobile communication device as claimed in claim 1, wherein
   the quality estimator calculates a signal to noise ratio (SNR) of the received signal; and
   the quality estimator generates the quality value according to the SNR; wherein the quality value is proportional to the SNR.

5. The mobile communication device as claimed in claim 1, wherein
   the quality estimator calculates one of signal to interference plus noise ratio (SINR), carrier to noise ratio (CNR), received signal power, carrier to noise plus interference ratio, node metric of the equalizer, soft value of the equalizer output, residual error after channel decoding, training sequence code (TSC) error count; and
   the quality estimator generates the quality value accordingly.

6. A data reception method for a mobile communication system, comprising:
   receiving a signal;
   demodulating the received signal to generate an equalizer output;
   decoding the equalizer output to generate a data sequence;
   estimating signal quality of the received signal to generate a quality value; and
   selectively performing CRC correction according to the quality value;
   wherein, if the quality value exceeds a threshold, performing both CRC check and CRC correction on the data sequence.

7. The data reception method as claimed in claim 6, further comprising, if the quality value does not exceed the threshold, performing only CRC check on the data sequence.

8. The data reception method as claimed in claim 6, wherein estimation of the signal quality comprises:
   calculating a bit error probability (BEP) of the equalizer output; and
   generating the quality value according to the BEP; wherein the quality value is inversely proportional to the BEP.

9. The data reception method as claimed in claim 6, wherein estimation of the signal quality comprises:
   calculating a signal to noise ratio (SNR) of the received signal; and
   generating the quality value according to the SNR; wherein the quality value is proportional to the SNR.

10. The data reception method as claimed in claim 6, wherein estimation of the signal quality comprises:
    calculating one of signal to interference plus noise ratio (SINR), carrier to noise ratio (CNR), received signal power, carrier to noise plus interference ratio, node metric of the equalizer, soft value of the equalizer output, residual error after channel decoding, training sequence code (TSC) error count; and
    generating the quality value according to the calculated result.

* * * * *